United States Patent [19]

Mercola et al.

[11] 3,787,777

[45] Jan. 22, 1974

[54] ELECTRIC AMPLIFIER

[75] Inventors: Peter A. Mercola; William R. Jacobs, both of Wilmette, Ill.

[73] Assignee: Beltone Electronics Corporation, Chicago, Ill.

[22] Filed: Nov. 19, 1971

[21] Appl. No.: 200,544

Related U.S. Application Data

[63] Continuation-in-part of Ser. No. 61,196, Aug. 5, 1970, abandoned.

[52] U.S. Cl. .................... 330/15, 330/17

[51] Int. Cl. .................... H03f 3/26

[58] Field of Search .................... 330/15, 28, 17

[56] References Cited

UNITED STATES PATENTS

| | | | |
|---|---|---|---|
| 3,015,780 | 1/1962 | Schayes et al. | 330/15 X |
| 3,537,023 | 10/1970 | Myer | 330/13 |
| 3,363,177 | 1/1968 | Houghton | 330/15 X |
| 3,424,992 | 1/1969 | Zielinski et al. | 330/28 X |
| 3,529,252 | 9/1970 | Long | 330/17 X |
| 3,462,698 | 8/1969 | Yagher et al. | 330/15 |

*Primary Examiner*—Nathan Kaufman

*Attorney, Agent, or Firm*—Molinare, Allegretti, Newitt & Witcoff

[57] ABSTRACT

An electronic circuit for reducing the distortion and increasing the temperature stability of amplifying transistors arranged in a push-pull configuration. The circuit preferably uses a driver transistor that is matched to the push-pull transistor which it drives in order to increase temperature stability. A capacitor is connected in series with the input lead of the driver transistor. Due to the non-linearity of the drive transistor input characteristics, the d. c. voltage level stored on the capacitor is varied in proportion to the magnitude of the input signal. As a result, the operating point of the push-pull transistors is continuously adjusted in proportion to the magnitude of the input signal, whereby cross-over distortion is reduced.

7 Claims, 3 Drawing Figures

INVENTORS
PETER A. MERCOLA
BY & WILLIAM R. JACOBS
Molinare, Allegretti, Newitt & Witcoff
ATTORNEYS INVENTORS
PETER A. MERCOLA
& WILLIAM R. JACOBS
BY Molinare, Allegretti
Newitt & Witcoff
ATTORNEYS

ELECTRIC AMPLIFIER

RELATED APPLICATION

This is a continuation-in-part of U. S. Application Ser. No. 61,196, entitled "Electric Amplifier" now abandoned, filed Aug. 5, 1970 in the names of the foregoing applicants.

BACKGROUND OF THE INVENTION

This invention relates to amplifiers, and more specifically relates to amplifiers using a push-pull configuration.

Class B and Class AB amplifiers arranged in a push-pull configuration have been used in the past for applications requiring high efficiency. One such application is in hearing aids which obtain their power from compact batteries. In such an application, a high efficiency Class B or AB amplifier provides significantly less current drain than a relatively low efficiency Class A amplifier, thereby increasing battery life. Much of this efficiency results from the fact that a Class B or AB amplifier draws little or no quiescent current in the absence of an input signal.

Although Class B and AB amplifiers are efficient enough for use in hearing aids, they have exhibited deficiencies which limit their overall usefulness. For example, applicants have found that such amplifiers produce considerable distortion. A major source of such distortion results from the fact that little or no current flows through a Class B or AB amplifier in the absence of a signal. When the amplifier is operated in this manner, it does not amplify all portions of an input signal to the same extent, and distortion results. In order to overcome this defect, the transistors used in such amplifiers must be specially designed to provide linear amplification over extremely wide ranges of currents, and must have carefully matched characteristics. Naturally, this process is expensive and still does not reduce distortion to acceptable levels. Aside from the foregoing defects, Class B and AB amplifiers have been difficult to compensate for changes in operating temperatures.

SUMMARY OF THE INVENTION

Class B and AB hearing aid amplifiers generally comprise first and second gain producing elements that are connected in a push-pull arrangement to a common load. Applicants have discovered that the temperature drift and distortion of such amplifiers can be dramatically reduced by use of the present invention.

According to a principal feature of the present invention, a third gain-producing element is connected to the first element in order to establish the operating point and d.c. quiescent current of the first and second elements. A capacitor is connected in series with the input lead of the third gain-producing element. By this means, the operating point of the first and second elements is set at a low level of current when no input signal is present, and is adjusted to increased levels of current as the magnitude of the input signal increases. Applicants have discovered that this apparatus drastically reduces the distortion present in the amplified signal. However, efficiency remains high because the d.c. quiescent current is extremely small for low-level input signals.

According to another feature of the invention, the first and third elements comprise semi-conductor elements of non-complementary types. By use of this technique, D.C. quiescent current in the first and second elements remains constant over a wide range of temperatures.

According to another feature of the invention, feed back is provided from the outputs of the first and second elements to an input stage of the amplifier. This feature biases the second element and further reduces distortion.

The advantages of the foregoing type of apparatus are at once apparent. By using the techniques taught herein, a Class B or AB amplifier may be built which reduces distortion and temperature drift to levels heretofore unattainable. Moreover, the efficiency of the amplifier remains extremely high, so that it may be driven from low-power battery sources for long periods of time.

DESCRIPTION OF THE DRAWINGS

These and other objects, advantages, and features of the present invention will hereinafter appear for purposes of illustration, but not of limitation, in connection with the accompanying drawings wherein.

DESCRIPTION OF THE PREFERRED EMBODIMENT

Figure 1:
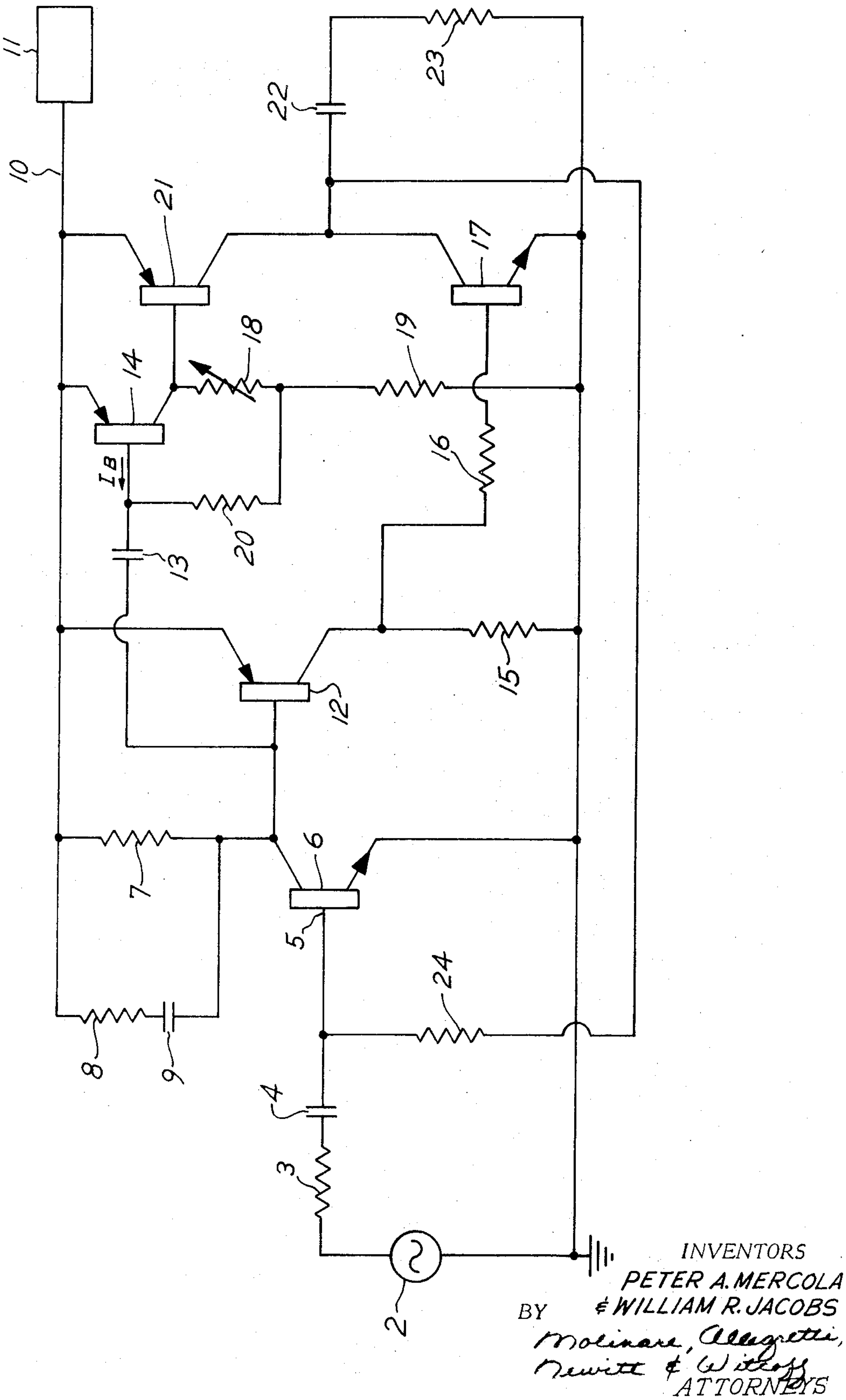
FIG. 1 is a schematic illustration of a preferred form of amplifier embodying the present invention.

Referring to FIG. 1, a preferred form of apparatus made in accordance with the present invention comprises a source of an input signal 2 that is connected over a resistor 3 and a capacitor 4 to the base 5 of an n-p-n transistor 6. The emitter of transistor 6 is grounded, and the collector thereof is connected over resistors 7, 8 and a capacitor 9 to a positive voltage supply conductor 10. Conductor 10 receives a positive voltage from a conventional power supply 11. The collector of transistor 6 is connected to the base of a p-n-p transistor 12, and is connected over a capacitor 13 to the base of a p-n-p transistor 14.

The emitter of transistor 12 is connected to conductor 10, and the collector thereof is connected over a resistor 15 to ground and over a resistor 16 to the base of an n-p-n transistor 17.

Figure 2:
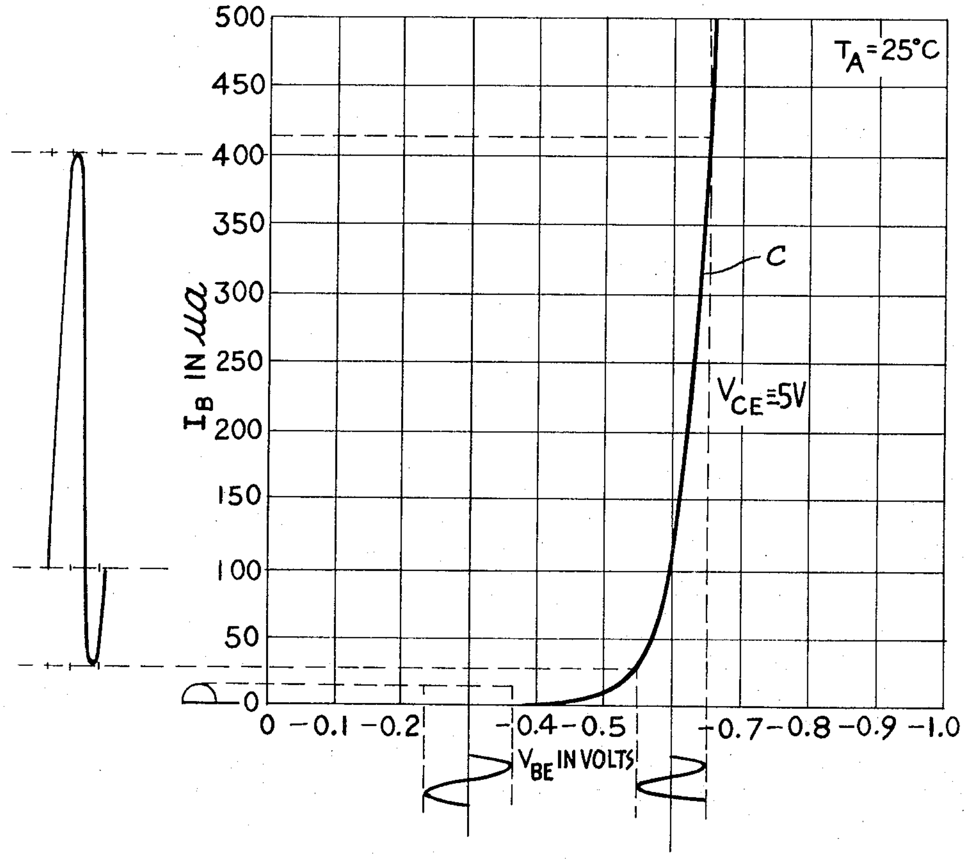
FIG. 2 is a plot of the input characteristics of a typical transistor, such as transistor 14 shown in FIG. 1.

The emitter of transistor 14 is connected to conductor 10, and the collector thereof is connected over resistors 18, 19 to ground. The junction of resistors 18, 19 is connected over a feed back and biasing resistor 20 to the base of transistor 14. Transistor 14 typically has an input characteristic of the type shown in FIG. 2 wherein the vertical axis represents base current IB in microamps and the horizontal axis represents the voltage between the base and emitter of transistor 14. Curve C is a plot of the various base currents IB resulting from corresponding input voltages at a temperature of 25°C. when the voltage between the collector and emitter of transistor 14 is held at 5.0 volts. As can be seen from FIG. 2, the input impedance of transistor 14 is non-linear.

The collector of transistor 14 is connected to the base of a p-n-p transistor 21. The emitter of transistor 21 is connected to conductor 10, and the collector thereof is connected to the collector of transistor 17.

The collectors of transistors 17 and 21 are both connected over a capacitor 22 and a load resistor 23 to ground. They are also connected over a feedback resistor 24 to base 5. Each of the foregoing transistors are gain-producing or amplifying elements in which their base-emitter junctions form input circuits and their collector-emitter junctions form output circuits. Those skilled in the art will also appreciate that transistors 17 and 21 are complementary types (i.e., n-p-n and p-n-p, respectively) which are connected in a push-pull configuration. In this configuration, transistor 21 produces the positive half of the signal conducted through load resistor 23, and a transistor 17 produces the negative half of the signal.

The d. c. quiescent current flow in transistors 17 and 21 is set by adjusting resistor 18 to an appropriate value. If Class B or AB operation is desired, the current must be set at negligible or very low values. Once resistor 18 is adjusted, transistor 17 is automatically biased at an appropriate operating point through the operation of feedback resistor 24. Since transistors 21 and 14 are non-complementary types (i.e., both are p-n-p types), transistor 14 will automatically maintain the preset quiescent current in transistors 17, 21 throughout a wide range of operating temperatures. Thus, as the base-emitter voltage of transistor 21 changes due to temperature variation, the base-emitter voltage of transistor 14 changes a like amount, thereby maintaining the quiescent current at the preset value.

The described circuit operates as follows. The input signal is amplified by transistor 6 in a well-known manner. Thereafter, the input signal is split. A portion of the signal is conducted to transistor 17, and another portion of the signal drives transistor 14. Due to the non-linearity of the input impedance of transistor 14, more current flows in the direction of current IB than in the reverse direction in response to a sinusoidal input signal. Applicants have discovered that this input characteristic can be used to reduce cross-over distortion by connecting capacitor 13 in series with the input (i.e., base) lead of transistor 14 as shown. As the magnitude of the input signal increases, the net d. c. component of charge stored by capacitor 13 increases, so that the d. c component of voltage on the base of transistor 14 increases.

Figure 3:
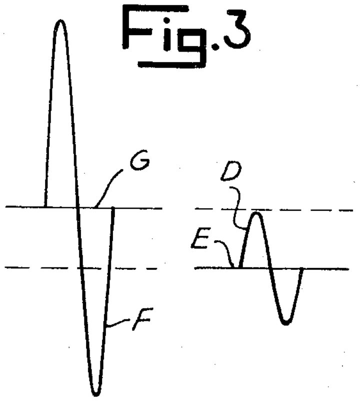
FIG. 3 diagrammatically illustrates the change in d.c. level on the base of transistor 14 with changes in the magnitude of the input signal.

The increase in d. c. voltage on the base of transistor 14 with an increase in input signal magnitude is illustrated diagrammtically in FIG. 3. Curve D of FIG. 3 represents a relatively small sinusoidal input signal on the base of transistor 14 that is centered around voltage E. Curve F of FIG. 3 represents a larger sinusoidal input signal on the base of transistor 14 that is centered around voltage G. The increase in voltage from level E to level G causes transistor 14 to conduct less, and, in turn, causes transistors 21 and 17 to conduct more. The increased conduction of transistors 17 and 21 decreases the distortion for large signals. More specifically, the increased conduction of transistors 17 and 21 causes these transistors to operate in a more linear region of their characteristic curves, and in addition, increases their gain so that the open loop gain of the entire amplifier is increased.

A portion of the signal produced on the collector of transistor 14 is fed back through resistor 20, thereby biasing transistor 14. Distortion is further reduced by feedback resistor 24.

One successful embodiment of the invention uses resistor values as follows:

| Resistor | Ohms |
|---|---|
| 3 | 13k |
| 7 | 10k |
| 8 | 100 |
| 15 | 18k |
| 16 | 10k |
| 18 | adjustable |
| 19 | 18k |
| 20 | 200k |
| 24 | 100k |

It is to be understood that the embodiment which has been described is merely illustrative of one application of the principles of the present invention. Numerous modifications may be made by those skilled in the art without departing from the true spirit and scope of the invention.

What is claimed is:

1. In a system for amplifying an input signal comprising a source of bias potential, a first amplifying element having a first input circuit and a first output circuit and a second amplifying element having a second input circuit and a second output circuit, said first and second amplifying elements being arranged in a push-pull configuration and having the first and second output circuits connected to a common lead so that d.c. current is capable of flowing from the source of bias potential through the first and second output circuits, improved means of setting and adjusting the d.c. current comprising in combination:

means for conducting said input signal to the second input circuit;

a third amplifying element having a third input circuit, a nonlinear input circuit impedance characteristic, and a third output circuit, said third output circuit of said third amplifying element being connected to the first input circuit;

bias means for establishing a bias voltage on the third input circuit in the absence of the input signal;

means for conducting said input signal to the third input circuit; and capacitor means connected in series with the third input circuit for changing the d.c. bias voltage on the third input circuit in proportion to the change in magnitude of the input signal, whereby the d.c. current flowing through said first and second output circuits is set at a low level when no input signal is present and the changing d.c. bias voltage is amplified and applied to the first input circuit by the third amplifying element as the input signal increases so that the d.c. current increases and crossover distortion is reduced.

2. Apparatus as claimed in claim 1, and further comprising means for feeding back a portion of the current flowing through the first and second output circuits to the means for conducting said input signal to the third input circuit.

3. Apparatus as claimed in claim 1, wherein said first and second elements are complemen-tary types of semiconductor amplifying elements.

4. Apparatus, as claimed in claim 1, wherein said first element and said third element are non-complementary types of semiconductor amplifying elements, whereby the d.c. current flowing through said first and second output circuits remains constant over a substantial range of temperatures.

5. Apparatus, as claimed in claim 1, wherein said first element is a p-n-p transistor, said second element is an n-p-n transistor, and said third element is a p-n-p transistor.

6. Apparatus, as claimed in claim 5, wherein:

said first element has a base-emitter junction in the first input circuit and a collector-emitter junction in the first output circuit;

said second element has a base-emitter junction in the second input circuit and a collector-emitter junction in the second output circuit; and said third element has a base-emitter junction in the third input circuit and a collector-emitter junction in the third output circuit

7. Apparatus, as claimed in claim 6, and further comprising means for feeding back a portion of the signal produced in the third output circuit to the third input circuit, said means comprising:

a first resistance having a first end connected to the collector of said third element and also having a second end; and a second resistance connected between the second end of said first resistance and the base of said third element.

* * * * *